US009029752B2

(12) United States Patent  
Saito et al.

(10) Patent No.: US 9,029,752 B2  
(45) Date of Patent: May 12, 2015

(54) SOLID STATE IMAGING APPARATUS INCLUDING REFERENCE SIGNAL GENERATOR WITH A SLOPE CONVERTING CIRCUIT

(75) Inventors: Kazuhiro Saito, Tokyo (JP); Hiroki Hiyama, Sagamihara (JP); Tetsuya Itano, Sagamihara (JP); Kohichi Nakamura, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 44 days.

(21) Appl. No.: 13/540,285

(22) Filed: Jul. 2, 2012

(65) Prior Publication Data

US 2013/0026343 A1 Jan. 31, 2013

(30) Foreign Application Priority Data

Jul. 28, 2011 (JP) ................................. 2011-165821

(51) Int. Cl.
*H01L 27/00* (2006.01)
*G01J 1/44* (2006.01)
(Continued)

(52) U.S. Cl.
CPC .............. *H04N 5/335* (2013.01); *H04N 5/357* (2013.01); *H04N 5/378* (2013.01); *H03M 1/1023* (2013.01); *H03M 1/123* (2013.01); *H03M 1/56* (2013.01)
USPC .................................... 250/208.1; 250/214 R

(58) Field of Classification Search
CPC ........... H03M 1/56; H03M 1/123; G01J 1/46; H01L 23/05; H01L 28/60
USPC .............. 250/214.1, 214 A, 214 LA, 214 LS, 250/214 AG, 214 C, 214 DC, 214 RC, 250/214 SW, 559.47, 208.1, 214 R; 330/67, 330/73, 200, 252, 295; 257/158, 159, 161, 257/226, 242, 298, 312, 532, 160, 431; 348/138, 300, 301, 302, 308, 309, 312
See application file for complete search history.

(56) References Cited

U.S. PATENT DOCUMENTS 6,670,990 B1 12/2003 Kochi et al. .................... 348/310
6,960,751 B2 11/2005 Hiyama et al. ............. 250/208.1
(Continued)

FOREIGN PATENT DOCUMENTS

EP 2182722 A1 5/2010
EP 2182722 A2 5/2010
(Continued)

OTHER PUBLICATIONS

European Search Report issued by the European Patent Office on Oct. 29, 2013, in connection with counterpart European Appl'n. No. 12176649.7.

*Primary Examiner* — Georgia Y Epps
*Assistant Examiner* — Don Williams
(74) *Attorney, Agent, or Firm* — Fitzpatrick, Cella, Harper & Scinto

(57) ABSTRACT

A solid-state imaging apparatus comprises a plurality of matrix pixels, a reference signal generator for generating a ramp signal, a counter for performing counting according to the ramp signal output, and an AD converter, arranged for each pixel column, for performing AD conversion by comparing a pixel signal from the pixel with the ramp signal. Further, the AD converter includes a comparator to which the pixel signal and the reference signal are input, a storage for storing the AD conversion result, and an slope converter, between the output terminal of the reference signal generator and the input terminal of the comparator, for changing a gradient of the ramp signal, so that the noise overlaid on the ramp signal changes depending on the gradient of the ramp signal. Thus, it is possible to prevent generation of a horizontal-line noise in the ramp signal.

8 Claims, 4 Drawing Sheets

(51) Int. Cl.
*H04N 5/335* (2011.01)
*H04N 5/357* (2011.01)
*H04N 5/378* (2011.01)
*H03M 1/10* (2006.01)
*H03M 1/12* (2006.01)
*H03M 1/56* (2006.01)

(56) References Cited

U.S. PATENT DOCUMENTS

| | | | |
|---|---|---|---|
| 7,110,030 B1 | 9/2006 | Kochi et al. | 348/308 |
| 7,187,052 B2 | 3/2007 | Okita et al. | 257/444 |
| 7,321,110 B2 | 1/2008 | Okita et al. | 250/208.1 |
| 7,408,210 B2 | 8/2008 | Ogura et al. | 257/233 |
| 7,429,764 B2 | 9/2008 | Koizumi et al. | 257/292 |
| 7,460,162 B2 | 12/2008 | Koizumi et al. | 348/294 |
| 7,462,810 B2 | 12/2008 | Kobayashi et al. | 250/208.1 |
| 7,528,878 B2 | 5/2009 | Sato et al. | 348/317 |
| 7,550,793 B2 | 6/2009 | Itano et al. | 257/239 |
| 7,557,847 B2 | 7/2009 | Okita et al. | 348/308 |
| 7,638,826 B2 | 12/2009 | Hiyama et al. | 257/291 |
| 7,719,587 B2 | 5/2010 | Ogura et al. | 348/302 |
| 7,741,593 B2 | 6/2010 | Iwata et al. | 250/214 |
| 7,755,688 B2 | 7/2010 | Hatano et al. | 348/300 |
| 7,812,873 B2 | 10/2010 | Hiyama et al. | 348/294 |
| 7,812,876 B2 | 10/2010 | Hiyama et al. | 348/300 |
| 7,825,974 B2 | 11/2010 | Itano et al. | 348/308 |
| 7,872,677 B2 * | 1/2011 | Kume | 348/243 |
| 7,920,192 B2 | 4/2011 | Watanabe et al. | 348/308 |
| 7,982,789 B2 | 7/2011 | Watanabe et al. | 348/308 |
| 8,023,025 B2 | 9/2011 | Itano et al. | 348/308 |
| 8,045,034 B2 | 10/2011 | Shibata et al. | 348/308 |
| 8,081,245 B2 | 12/2011 | Itano et al. | 348/301 |
| 8,085,319 B2 | 12/2011 | Ono et al. | 348/241 |
| 8,106,955 B2 | 1/2012 | Okita et al. | 348/220.1 |
| 8,159,577 B2 | 4/2012 | Iwata et al. | 348/296 |
| 8,208,055 B2 | 6/2012 | Hiyama | 348/300 |
| 8,218,050 B2 | 7/2012 | Ogura et al. | 348/308 |
| 8,289,431 B2 | 10/2012 | Itano | 348/308 |
| 8,492,697 B2 * | 7/2013 | Neubauer et al. | 250/208.1 |
| 2008/0112016 A1 | 5/2008 | Kume | |
| 2009/0167585 A1 | 7/2009 | Yeom | 341/155 |
| 2009/0219424 A1 | 9/2009 | Sonoda et al. | 348/302 |
| 2009/0316034 A1 | 12/2009 | Kusuda | |
| 2009/0322922 A1 | 12/2009 | Saito et al. | 348/308 |
| 2010/0149394 A1 | 6/2010 | Yamazaki et al. | 348/308 |
| 2010/0231768 A1 | 9/2010 | Utsunomiya et al. | |
| 2012/0026371 A1 | 2/2012 | Itano et al. | 348/301 |

FOREIGN PATENT DOCUMENTS

| | | |
|---|---|---|
| JP | 11-168383 | 6/1999 |
| JP | 2002-232291 A | 8/2002 |
| JP | 2002232291 A | 8/2002 |

* cited by examiner

SOLID STATE IMAGING APPARATUS INCLUDING REFERENCE SIGNAL GENERATOR WITH A SLOPE CONVERTING CIRCUIT

BACKGROUND OF THE INVENTION

1. Field of the Invention

The present invention relates to a solid-state imaging apparatus in which an AD (analog-to-digital) converting circuit is provided.

2. Description of the Related Art

A solid-state imaging apparatus such as a CMOS (complementary metal-oxide semiconductor) image sensor or the like which has an AD converting circuit is used for an image input device such as a digital camera or the like. As the AD converting circuit included in the solid-state imaging apparatus, there is an AD converting circuit which obtains digital data by comparing a pixel signal for each column with a common ramp signal (reference signal). With respect to the AD converting circuit using the ramp signal, a high-resolution AD converting technique, which performs two-step AD conversion by using a low-order bit ramp signal and a high-order bit ramp signal having different temporal change rate, has been disclosed (Japanese Patent Application Laid-Open No. 2002-232291). Further, an AD conversion gain is made variable by changing a gradient of the ramp signal output from a ramp signal source in a single-slope AD converting circuit.

However, when the plurality of ramp signals are used in the AD converting circuit, accuracy of the individual ramp signal and relative accuracy among the ramp signals cause an AD conversion error. Further, when increasing the AD conversion gain by reducing the slope of the ramp signal, line noise may be observed for each pixel row, since a noise generated at an output buffer stage of the ramp signal source does not depend on the gradient of the ramp signal.

SUMMARY OF THE INVENTION

The present invention has been completed in consideration of such a problem as described above, and can reduce generation of a line noise even when changing an AD conversion gain by changing a gradient of a ramp signal.

A solid-state imaging apparatus according to one aspect of the present invention comprises: a plurality of pixels arranged in a matrix, each of the plurality of pixels including a photoelectric conversion element; a reference signal generating circuit configured to generate a reference signal of which a signal level changes with the passage of time; a counter circuit configured to perform a counting operation according to the change of the reference signal; and an AD converting circuit, arranged for each column of the pixels, configured to perform analog-to-digital conversion to a pixel signal transferred from the pixel by comparing the pixel signal with the reference signal, wherein the AD converting circuit includes, a comparator having a first input terminal to which the pixel signal is input and a second input terminal to which the reference signal is input, a storing unit configured to store a count value of the counter circuit when an output of the comparator is inverted, and an slope converting circuit including a first capacitor connected between an output terminal of the reference signal generating circuit and the second input terminal of the comparator, and a second capacitor connected between the second input terminal of the comparator and a reference voltage.

Further features of the present invention will become apparent from the following description of exemplary embodiments with reference to the attached drawings.

DESCRIPTION OF THE EMBODIMENTS

Hereinafter, preferred embodiments of the present invention will be described in detail with reference to the accompanying drawings.

First Embodiment

Hereinafter the first embodiment of the present invention will be described.

Figure 1:
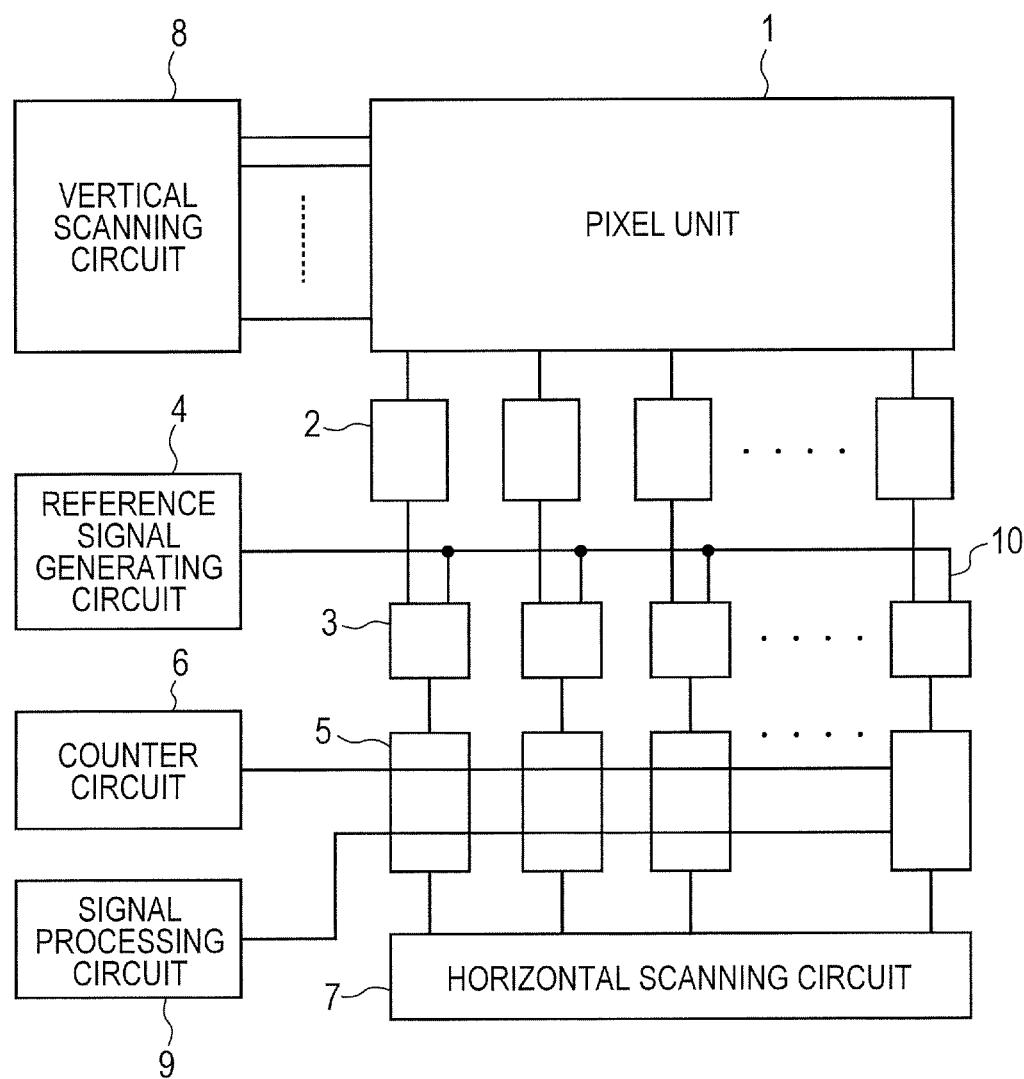
FIG. 1 is a block diagram illustrating an example of a constitution of a solid-state imaging apparatus according to an embodiment of the present invention.

FIG. 1 is a block diagram illustrating an example of a constitution of a solid-state imaging apparatus according to the first embodiment of the present invention. Here, the solid-state imaging apparatus includes a pixel unit 1, amplifying circuits 2, comparing units 3, a reference signal generating circuit 4, storing units 5, a counter circuit 6, a horizontal scanning circuit 7, a vertical scanning circuit 8, and a signal processing circuit 9. More specifically, in the pixel unit 1, a plurality of pixels including a photoelectric converting element are arranged in a matrix (that is, in a row direction and a column direction). The amplifying circuit 2, the comparing unit 3 and the storing unit 5 are arranged with respect to each column, so as to correspond to each column of the pixel unit 1. Here, it should be noted that the amplifying circuit 2, the comparing unit 3 and the storing unit 5 provided with respect to each column together constitute an AD converting circuit which performs analog-to-digital conversion to a pixel signal transferred from the pixel in the pixel unit 1.

Figure 3:
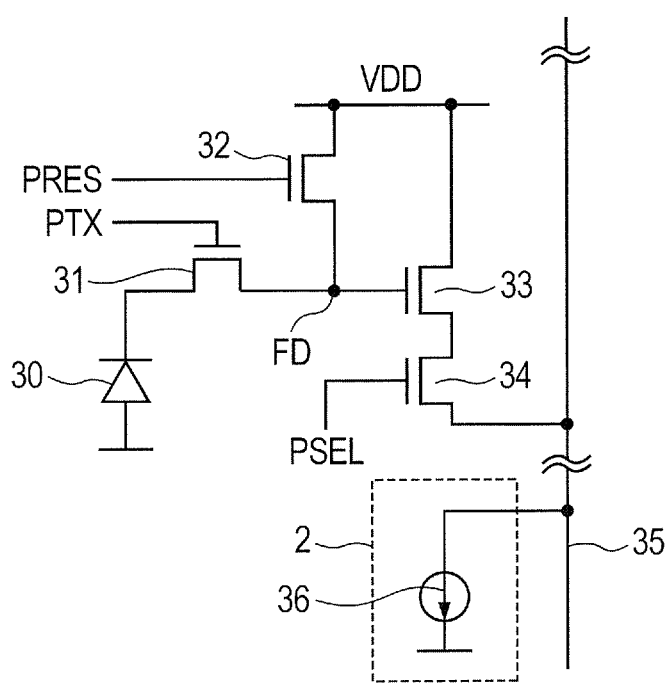
FIG. 3 is a circuit diagram illustrating an example of a pixel according to the embodiment of the present invention.

Each of the pixels provided in the pixel unit 1 includes, for example, a photoelectric conversion element (photodiode) 30 and four MOS (metal-oxide semiconductor) transistors 31, 32, 33 and 34, as illustrated in FIG. 3. Here, the photoelectric conversion element 30 generates electrical charges by photoelectric conversion. The MOS transistor 31 is the transfer transistor to be used to read the electrical charges accumulated by the photoelectric conversion element 30, and conduction/non-conduction (on/off) of which is controlled in response to a signal PTX. The MOS transistor 32 is the reset transistor to be used to reset a floating diffusion FD, and conduction/non-conduction (on/off) of which is controlled in response to a signal PRES.

The MOS transistor 33 is the source follower transistor to be used to amplify electrical charges in the floating diffusion FD and convert the amplified charges into a signal voltage. Further, the MOS transistor 34 is the row selection transistor to be used to select a row of the pixels arranged in the matrix by controlling connection between an output of a source follower and a pixel signal output line 35, and conduction/non-conduction (on/off) of which is controlled in response to a signal PSEL. Furthermore, a constant current supply 36 provided in the amplifying circuit 2 is the source follower constant current source.

The amplifying circuit 2 amplifies a pixel signal read from the pixel unit 1. Then, the pixel signal amplified by the amplifying circuit 2 and a ramp signal VRMP (not illustrated) generated by the reference signal generating circuit 4 and supplied through a signal line 10 are input to the comparing unit 3. Here, the comparing unit 3, which includes a differential input comparator, compares the magnitude of the voltage of the input pixel signal with the magnitude of the voltage of the input ramp signal VRMP, and then transitions an output level from a high level to a low level or from a low level to a high level when the magnitude relation of the signal voltages is inverted.

The reference signal generating circuit 4, which is connected in common to the plurality of comparing units 3, generates the ramp signal serving as a reference signal. Here, it should be noted that the ramp signal is the signal of which the signal level (i.e., magnitude of the signal) simply changes with the passage of time. For example, the ramp signal is the signal of which the output voltage simply decreases or increases with the passage of time. The counter circuit 6, which is connected in common to the storing units 5 of the plurality of columns, performs a counting operation according to output of the ramp signal serving as the reference signal transferred from the reference signal generating circuit 4, and outputs a count value based on the counting operation. In other words, the counter circuit 6 performs the counting operation during a period that the ramp signal serving as the reference signal is being output from the reference signal generating circuit 4 (that is, a period that the ramp signal is changing), and outputs the count value based on the counting operation. The storing unit 5 stores the count value output from the counter circuit 6 as digital data at a time when the output potential of the corresponding comparing unit 3 is inverted.

The storing unit 5 can store two kinds of data, i.e., a reference signal N and a valid signal S (both not illustrated) of the pixel signal, as the digital data. When the two kinds of data are stored in the storing unit, a difference process of (S-N) is performed by the later-stage signal processing circuit 9. Incidentally, if the counter circuit 6 which has both a down-mode function and an up-mode function is used, the count result is equivalent to the result of the difference process of (S-N), whereby the storing unit 5 only has to be able to store one kind of data.

The digital data stored in the storing units 5 are sequentially transferred to the signal processing circuit 9 for each column by the horizontal scanning circuit 7. Here, a series of operations of reading the pixel signals from the pixels is performed while the pixel row of the pixel unit 1 is properly selected. Incidentally, it should be noted that a circuit which supplies a pulse necessary for each circuit and controls its generation timing is omitted in FIG. 1.

Figure 2:
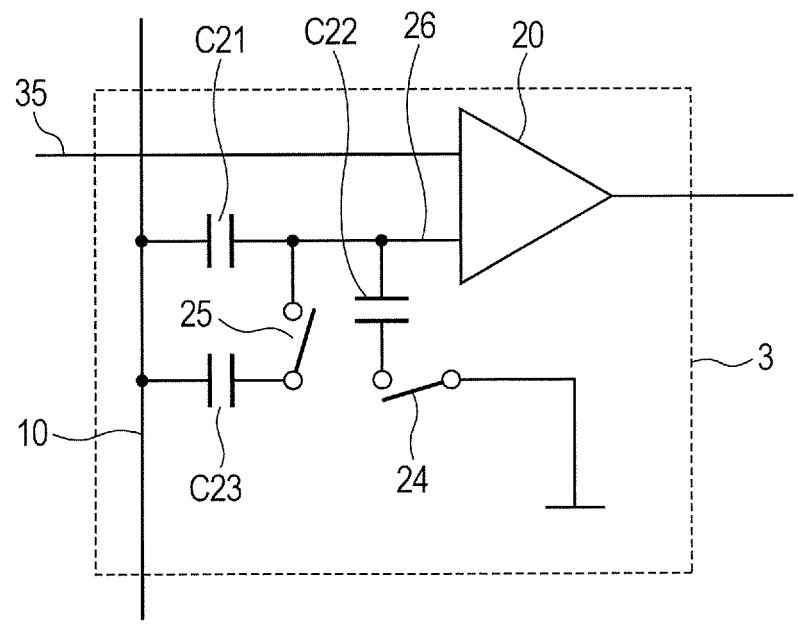
FIG. 2 is a circuit diagram illustrating an example of a comparing unit according to a first embodiment of the present invention.

FIG. 2 is a circuit diagram illustrating an example of the circuit constitution of the comparing unit 3 according to the first embodiment of the present invention. In the first embodiment, the comparing unit 3 includes a differential input comparator 20, an input capacitor C21, capacitors C22 and C23 for adjusting the slope of the ramp signal, and switches 24 and 25 respectively for performing connection control for the capacitors C22 and C23.

A first input terminal of the differential input comparator 20 is connected to the amplifying circuit 2, and a second input terminal of the differential input comparator 20 is connected to the signal line 10 through the input capacitor (first capacitor) C21. One end of the signal line 10 is connected to the output terminal of the reference signal generating circuit 4 which generates the ramp signal serving as the reference signal. Further, a first series circuit in which the capacitor (second capacitor) C22 and the switch (first switch) 24 are connected in series is connected between the second input terminal of the differential input comparator 20 and the reference voltage. Furthermore, a second series circuit in which the capacitor (third capacitor) C23 and the switch (second switch) 25 are connected in series is connected between the second input terminal of the differential input comparator 20 and the signal line 10.

Here, it should be noted that the input capacitor C21, the capacitors C22 and C23, and the switches 24 and 25 together constitute a reference signal slope converting circuit which changes the slope of the ramp signal serving as the reference signal. In the present embodiment, the reference signal slope converting circuit is connected between the output terminal of the reference signal generating circuit 4 and the second input terminal of the differential input comparator 20, the slope of the ramp signal output from the reference signal generating circuit 4 is controlled by the reference signal slope converting circuit, and the ramp signal is then input to the differential input comparator 20. Subsequently, the connection control for the capacitors C22 and C23 is performed by performing on/off control of the respective switches 24 and 25, and capacitance division is then performed by the connected capacitors C22 and C23 and the input capacitor C21 on the basis of the connection control, whereby the slope of the ramp signal output from the reference signal generating circuit 4 is changed.

The slope of a ramp signal RMP to be input to the differential input comparator 20 through a signal line 26 can be expressed by following expressions (1), (2) and (3), in accordance with the control of the switches 24 and 25. In the following description, a reference symbol RMPA indicates the slope of the ramp signal RMP to be input to the differential input comparator 20 when both the switches 24 and 25 are off, a reference symbol RMPB indicates the slope of the ramp signal RMP to be input to the differential input comparator 20 when both the switches 24 and 25 are on, and a reference symbol RMPC indicates the slope of the ramp signal RMP to be input to the differential input comparator 20 when the switch 24 is on and the switch 25 is off. Further, in the following expressions, it is assumed that a reference symbol VRMP indicates the slope of a ramp signal VRMP to be output from the reference signal generating circuit 4, and reference symbols C21, C22 and C23 respectively indicate the capacitance values of the input capacitor C21 and the capacitors C22 and C23. Incidentally, to simplify the description, a parasitic capacitance of each terminal is omitted in the following expressions.

$$RMPA = VRMP \quad (1)$$

$$RMPB = VRMP \times (C21 + C23)/(C21 + C22 + C23) \quad (2)$$

$$RMPC = VRMP \times C21/(C21 + C22) \quad (3)$$

Figure 4:
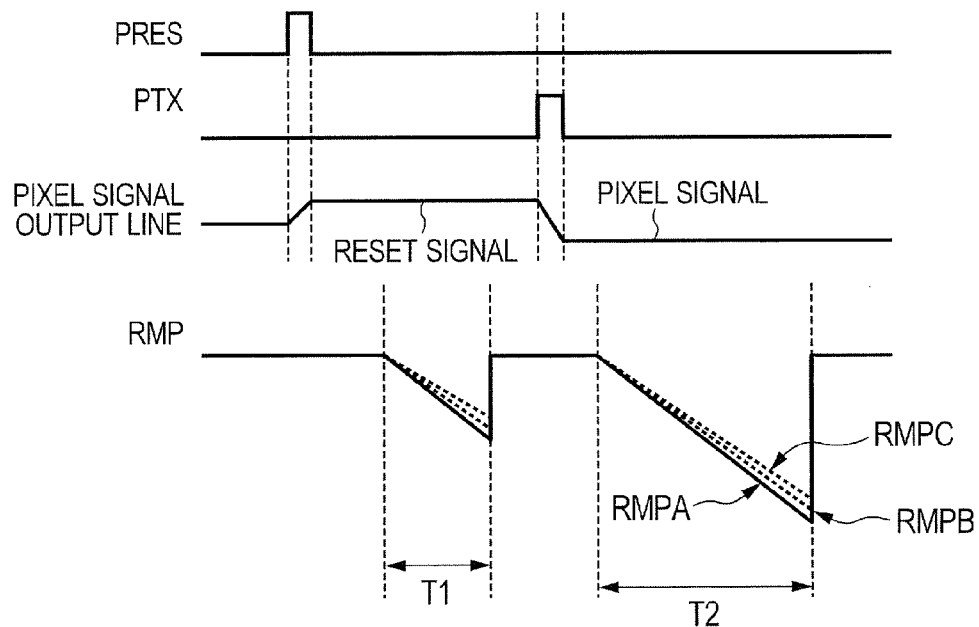
FIG. 4 is a timing chart illustrating signal waveforms according to the first embodiment of the present invention.

Subsequently, the operation of the solid-state imaging apparatus according to the first embodiment will be described. FIG. 4 is a timing chart illustrating signal waveforms according to the first embodiment of the present invention. More specifically, the illustrated timing chart indicates the circuit operation of the pixel corresponding to one pixel row and the operation of the reference signal generating circuit. Incidentally, although it is omitted in FIG. 4, the signal PSEL corresponding to the row from which the pixel signal is read is set to the high level. A reset signal obtained by resetting the pixel unit 1 and a photoelectric conversion signal overlaid on the reset signal are read as the pixel signal from the pixel unit 1.

First, the reset MOS transistor 32 becomes on because the level of the signal PRES changes to the high level, whereby the floating diffusion FD is reset. Subsequently, the reset MOS transistor 32 becomes off because the level of the signal PRES changes to the low level, whereby the reset signal is output through the amplifying circuit 2. Then, a first AD conversion process is performed to the output reset signal in a period T1. In the first AD conversion process, the output level of the comparing unit 3 is transitioned from the high level to the low level or from the low level to the high level when the magnitude relation of the slope-controlled ramp signal RMP to be input to the differential input comparator 20 and the reset signal is inverted. The count value output from the counter circuit 6 is stored as first digital data by the storing unit 5 at a time when the output potential of the comparing unit 3 is inverted.

Subsequently, after the first AD conversion process was completed, the level of the signal PTX changes to the high level in the pixel unit 1, and the electrical charges accumulated in the photoelectric conversion element 30 are transferred to the floating diffusion FD, whereby the pixel signal is output from the amplifying circuit 2. As well as the case of the reset signal, a second AD conversion process is performed to the output pixel signal in a period T2. Then, the count value output from the counter circuit 6 is stored as second digital data by the storing unit 5 at a time when the magnitude relation of the ramp signal RMP to be input to the differential input comparator 20 and the pixel signal is inverted and the output potential of the comparing unit 3 is inverted.

The first digital data and the second digital data respectively stored in the storing unit 5 of each column are then transferred to the signal processing circuit 9 by the horizontal scanning circuit 7, and the difference process between the first digital data and the second digital data is performed by the signal processing circuit 9, whereby a variation in the characteristics of the comparing units 3 of the respective columns is eliminated. Incidentally, the difference process may not be performed by the signal processing circuit 9. In this case, a signal process including the difference process and the like may be performed outside the solid-state imaging apparatus.

In each of the first AD conversion process and the second AD conversion process both described above, the value of the digital data obtained as the processed result is determined based on the signal (i.e., the reset signal, the pixel signal) transferred from the pixel and the gradient of the ramp signal RMP to be input to the differential input comparator 20. As illustrated in FIG. 4, the gradient of the ramp signal RMP to be input to the differential input comparator 20 is variable as indicated by the above expressions (1), (2) and (3), by properly controlling the switches 24 and 25. Thus, for example, it is possible to adjust the gradient even if there is a variation due to chip individual differences.

Second Embodiment

Subsequently, the second embodiment of the present invention will be described hereinafter.

Figure 5:
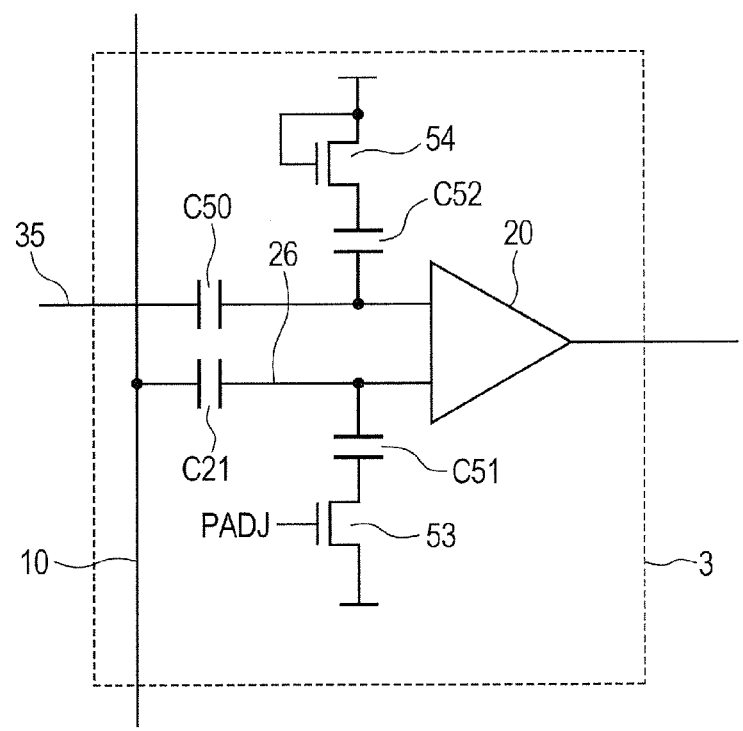
FIG. 5 is a circuit diagram illustrating an example of a comparing unit according to a second embodiment of the present invention.

A solid-state imaging apparatus according to the second embodiment is the same as the solid-state imaging apparatus according to the first embodiment, except for a comparing unit. Consequently, only a portion different from that in the first embodiment will be described in the present embodiment. FIG. 5 is a circuit diagram illustrating an example of a comparing unit 3 according to the second embodiment of the present invention. Here, it should be noted that, in FIG. 5, the constituent elements having the same functions as those of the constituent elements illustrated in FIG. 2 are indicated by the corresponding same reference numerals and symbols respectively, and the descriptions thereof will be omitted because they are redundant.

In the comparing unit 3 of the second embodiment, a first input terminal of a differential input comparator is connected to the amplifying circuit 2 through a capacitor (fourth capacitor) C50, and a second input terminal of the differential input comparator 20 is connected to a signal line 10 through an input capacitor (first capacitor) C21. Further, a dummy circuit (third series circuit) which consists of a capacitor (fifth capacitor) C52 and a MOS transistor 54 being in a non-conduction state at any time is connected to the first input terminal of the differential input comparator 20. A first electrode of the capacitor C52 is connected to the first input terminal of the differential input comparator 20, and a second electrode thereof is connected to the drain of the MOS transistor 54. The gate and the source of the MOS transistor 54 is connected to predetermined potential (for example, a reference voltage). Further, a series circuit (first series circuit) in which a capacitor (second capacitor) C51 for constituting capacitance division and adjusting the slope of a ramp signal and a switch (first switch) 53 are connected in series is connected between the second input terminal of the differential input comparator 20 and the reference voltage. Here, conduction/non-conduction (on/off) of the switch 53 is controlled in response to a signal PADJ.

A capacitance division ratio is changed by controlling on/off of the switch 53, whereby the slope of a ramp signal RMP to be input to the differential input capacitor 20 is changed. Further, by providing the dummy circuit which consists of the capacitor C52 and the MOS transistor 54 being in the non-conduction state, symmetry of the two input portions of the differential input capacitor 20 is maintained when the switch 53 is off.

Third Embodiment

Subsequently, the third embodiment of the present invention will be described hereinafter.

Figure 6:
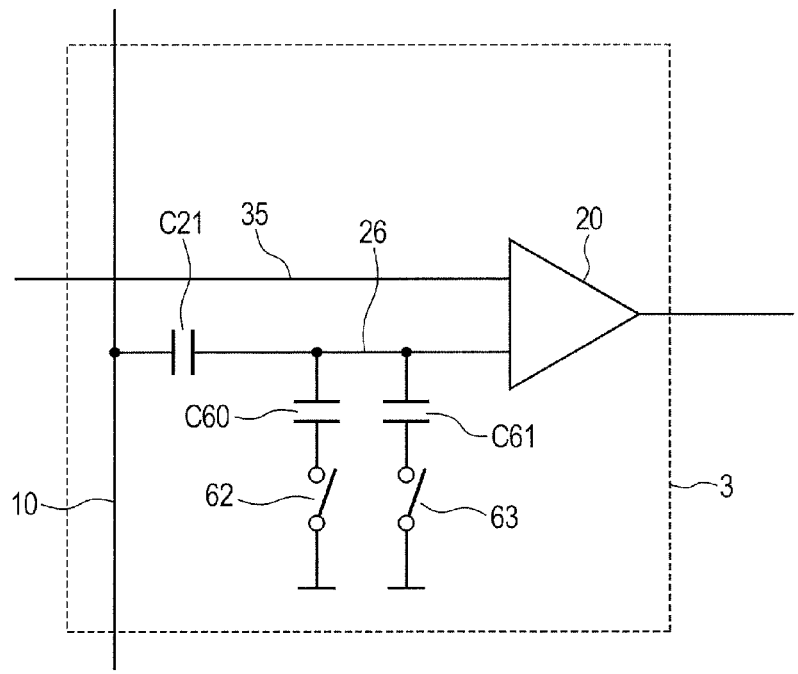
FIG. 6 is a circuit diagram illustrating an example of a comparing unit according to a third embodiment of the present invention.

A solid-state imaging apparatus according to the third embodiment is the same as the solid-state imaging apparatus according to the first embodiment, except for a comparing unit. Consequently, only a portion different from that in the first embodiment will be described in the present embodiment. FIG. 6 is a circuit diagram illustrating an example of a comparing unit 3 according to the third embodiment of the present invention. Here, it should be noted that, in FIG. 6, the constituent elements having the same functions as those of the constituent elements illustrated in FIG. 2 are indicated by the corresponding same reference numerals and symbols respectively. In the third embodiment, the comparing unit 3 includes a differential input comparator 20, an input capacitor C21, capacitors C60 and C61 for adjusting the slope of a ramp signal, and switches 62 and 63 respectively for performing connection control for the capacitors C60 and C61.

In the comparing unit of the third embodiment, a first input terminal of the differential input comparator 20 is connected to the amplifying circuit 2, and a second input terminal of the differential input comparator 20 is connected to a signal line 10 through the input capacitor (first capacitor) C21. One end of the signal line 10 is connected to the output terminal of the reference signal generating circuit 4 which generates the ramp signal serving as a reference signal. Further, a series circuit (first series circuit) in which the capacitor (second capacitor) C60 and the switch (first switch) 62 are connected in series is connected between the second input terminal of the differential input comparator 20 and the reference voltage. Furthermore, a series circuit (first series circuit) in which the capacitor (second capacitor) C61 and the switch (first switch) 63 are connected in series is connected between the second input terminal of the differential input comparator 20 and the reference voltage. That is, the two series circuits are connected in parallel between the second input terminal of the differential input comparator 20 and the reference voltage.

Here, it should be noted that the input capacitor C21, the capacitors C60 and C61, and the switches 62 and 63 together constitute a reference signal slope converting circuit which changes the slope of the ramp signal serving as the reference signal. The slope of the ramp signal output from the reference signal generating circuit 4 is controlled by the reference signal slope converting circuit connected between the output terminal of the reference signal generating circuit 4 and the second input terminal of the differential input comparator 20, and the ramp signal is then input to the differential input comparator 20. Subsequently, the connection control for the capacitors C60 and C61 is performed by performing on/off control of the respective switches 62 and 63, and capacitance division is then performed by the connected capacitors C60 and C61 and the input capacitor C21 on the basis of the connection control, whereby the slope of the ramp signal output from the reference signal generating circuit 4 is changed.

The slope of a ramp signal RMP to be input to the differential input comparator 20 through a signal line 26 can be expressed by following expressions (4), (5) and (6), in accordance with the control of the switches 62 and 63. In the following description, a reference symbol RMPD indicates the slope of the ramp signal RMP to be input to the differential input comparator 20 when both the switches 62 and 63 are off (when a gain×1 is set), a reference symbol RMPE indicates the slope of the ramp signal RMP to be input to the differential input comparator 20 when the switch 62 is on and the switch 63 is off (when a gain×2 is set), and a reference symbol RMPF indicates the slope of the ramp signal RMP to be input to the differential input comparator 20 when both the switches 62 and 63 are on (when a gain×4 is set). Here, it is assumed that a ratio of the capacitance values of the capacitors C21, C60 and C61 is 1:1:2. Further, in the following expressions, it is assumed that a reference symbol VRMP indicates the slope of a ramp signal VRMP to be output from the reference signal generating circuit 4. Incidentally, to simplify the description, a parasitic capacitance of each terminal is omitted in the following expressions.

$$RMPD = VRMP \times (1) \quad (4)$$

$$RMPE = VRMP \times (\tfrac{1}{2}) \quad (5)$$

$$RMPF = VRMP \times (\tfrac{1}{4}) \quad (6)$$

Figure 7:
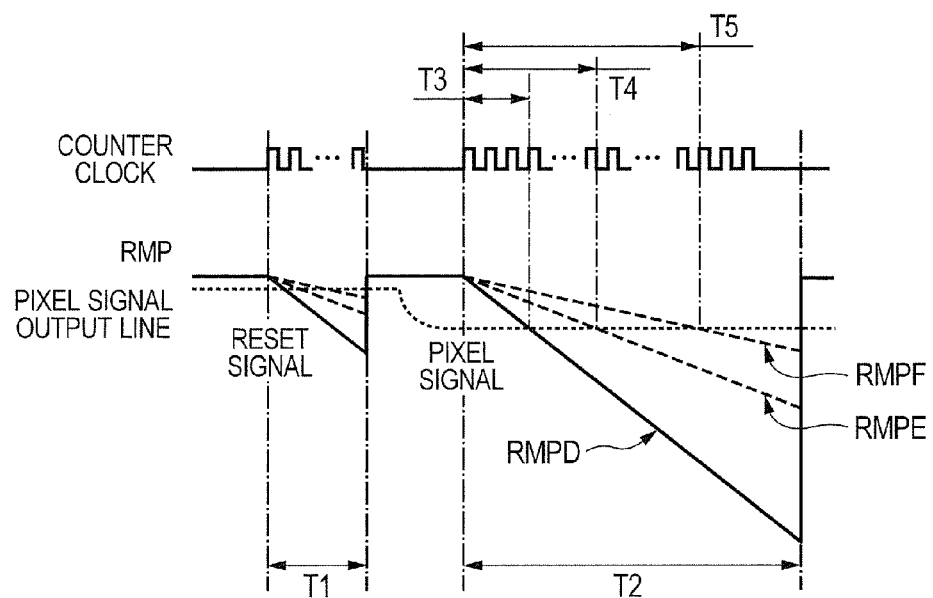
FIG. 7 is a timing chart illustrating signal waveforms according to the third embodiment of the present invention.

FIG. 7 is a timing chart illustrating signal waveforms according to the third embodiment of the present invention. More specifically, the illustrated timing chart indicates the circuit operation of the pixel corresponding to one pixel row and the operation of the reference signal generating circuit.

Incidentally, since the circuit operation of the pixel and the operation of the reference signal generating circuit in the third embodiment are the same as the circuit operation of the pixel and the operation of the reference signal generating circuit in the first embodiment, the descriptions of these operations will be omitted.

In the third embodiment, as illustrated in FIG. 7, the gradient of the ramp signal RMP to be input to the differential input comparator 20 is one time, (½) times and (¼) times the ramp signal VRMP to be output from the reference signal generating circuit 4 by properly controlling the switches 62 and 63. The digital data to be subjected to the AD conversion comes to be equivalent to one time (period T3), two times (period T4) and four times (period T5), by changing the gradient of the ramp signal to be input to the differential input comparator 20. At this time, the magnitude of a noise overlaid on the ramp signal RMP to be input to the differential input comparator 20 changes to one time, (½) times and (¼) times, as well as the gradient of the ramp signal. For this reason, it is possible to obtain excellent AD conversion accuracy even in case of adjusting the gain by changing the gradient of the ramp signal. Also, it is possible to suppress generation of a horizontal-line noise because the noise overlaid on the ramp signal changes as well as the gradient of the ramp signal.

Incidentally, it should be noted that each of the capacitors provided in the respective comparing units 3 of the above-described first to third embodiments is, for example, a diffusion capacitor, an MIN (Metal-Insulator-Metal) capacitor, a capacitor constituted by polysilicon, or the like. Besides, although the constitution in which the circuits such as the amplifying circuits 2, the comparing units 3 and the like are provided only on the underside of the pixel unit 1 is illustrated in FIG. 1 as the example of the solid-state imaging apparatus according to the embodiments of the present invention, the present invention is not limited to the relevant constitution. That is, it is possible to adopt a constitution in which the circuits same as those provided on the underside of the pixel unit 1 are provided also on the upside thereof. In this case, it is desirable to determine whether to read the pixel signal for each column to the upside of the pixel unit or the underside of the pixel unit. Moreover, in each of the above embodiments, although the constitution in which the storing unit 5 is provided for each column and the counter circuit 6 commonly connected to the storing units 5 of the plurality of columns is provided is described as the example, the present invention is not limited to the relevant constitution. That is, for example, it is possible to adopt a constitution in which the counter circuit 6 is provided for each column.

Incidentally, all the above embodiments merely show the examples of concretization in the case where the present invention is carried out. That is, the technical scope of the present invention must not be interpreted to a limited extent by these embodiments. That is, the present invention can be carried out in a variety of ways without departing from its technical idea or its main feature.

The solid-state imaging apparatus can be applied to, for example, a scanner, a video camera, a digital still camera and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-165821, filed Jul. 28, 2011, which is hereby incorporated by reference herein in its entirety.

What is claimed is:

1. A solid-state imaging apparatus, comprising:
a plurality of pixels arranged in a matrix, each of the plurality of pixels including a photoelectric conversion element;
a reference signal generating circuit configured to generate a reference signal of which a signal level changes over time with a slope;
a counter circuit configured to perform a counting operation according to the change of the reference signal; and
an AD converting circuit, arranged for each column of the pixels, configured to perform analog-to-digital conversion to a pixel signal transferred from the pixel by comparing the pixel signal with the reference signal, said AD converting circuit comprising (i) a comparator having a first input terminal to which the pixel signal is input and a second input terminal to which the reference signal is input, (ii) a storing unit configured to store a count value of the counter circuit when an output of the comparator is inverted, and (iii) a slope converting circuit configured to adjust the slope of the reference signal, comprising a first capacitor connected between an output terminal of the reference signal generating circuit and the second input terminal of the comparator, and at least one second capacitor connected between the second input terminal of the comparator and a reference voltage, and a first switch configured to electrically separate the connection between the second input terminal of the comparator and the reference voltage via the at least one second capacitor.

2. The solid-state imaging apparatus according to claim 1, wherein the at least one second capacitor comprises a plurality of capacitors which are connected in parallel between the second input terminal of the comparator and the reference voltage.

3. The solid-state imaging apparatus according to claim 2, wherein the first switch configured to electrically separate the connection between the second input terminal of the comparator and the reference voltage via at least a part of the plurality of second capacitors.

4. The solid-state imaging apparatus according to claim 1, further comprising a third capacitor, wherein the third capacitor is connected, in parallel with the first capacitor, between the output terminal of the reference signal generating circuit and the second input terminal of the comparator.

5. The solid-state imaging apparatus according to claim 4, further comprising:
a fourth capacitor connected to the first input terminal of the comparator, the pixel signal from the pixel being supplied to the fourth capacitor; and
a fifth capacitor connected to the first input terminal of the comparator.

6. The solid-state imaging apparatus according to claim 5, further comprising:
a first transistor provided in series with the second capacitor; and
a second transistor provided in series with the fifth capacitor, wherein
a non-conduction state of the second transistor is maintained.

7. The solid-state imaging apparatus according to claim 6, wherein a control electrode and one main electrode of the second transistor are short-circuited.

8. An imaging system including the solid-state imaging apparatus described in claim 1, wherein said imaging system is a scanner, a video camera or a digital still camera.

* * * * *